(12) United States Patent
Jung et al.

(10) Patent No.: US 9,773,948 B2
(45) Date of Patent: Sep. 26, 2017

(54) LIGHT EMITTING DEVICE

(71) Applicant: LG INNOTEK CO., LTD., Seoul (KR)

(72) Inventors: Se Yeon Jung, Seoul (KR); Yong Gyeong Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/755,933

(22) Filed: Jun. 30, 2015

(65) Prior Publication Data
US 2016/0005917 A1  Jan. 7, 2016

(30) Foreign Application Priority Data

Jul. 1, 2014 (KR) .................. 10-2014-0081739

(51) Int. Cl.
*H01L 33/38* (2010.01)
*H01L 33/40* (2010.01)
*H01L 33/42* (2010.01)

(52) U.S. Cl.
CPC ............ *H01L 33/38* (2013.01); *H01L 33/405* (2013.01); *H01L 33/42* (2013.01)

(58) Field of Classification Search
CPC ........ H01L 33/38; H01L 33/405; H01L 33/42
See application file for complete search history.

(56) References Cited

U.S. PATENT DOCUMENTS 6,169,297 B1 *   1/2001  Jang et al. ................. 257/99
2010/0163910 A1 * 7/2010  Bougrov ............. H01L 33/38
                                                    257/98
2012/0049232 A1 * 3/2012  Okabe et al. .............. 257/98
2012/0248490 A1 * 10/2012 Weng .................. H01L 33/38
                                                    257/99
2012/0305889 A1  12/2012  Lim et al.

FOREIGN PATENT DOCUMENTS

KR   10-2012-0134456 A   12/2012
KR   10-2014-0020420 A    2/2014

OTHER PUBLICATIONS

Bessolov et al. "dependence of Mechanism of Current Flow in the In-n-GaN alloyed ohmic contact on the Majority Carrier Concentration," Semiconductors vol. 42 No. 11 2008.*

* cited by examiner

*Primary Examiner* — Matthew Reames
(74) *Attorney, Agent, or Firm* — Birch, Stewart, Kolasch & Birch, LLP

(57) ABSTRACT

Embodiments provide a light emitting device including a substrate, a light emitting structure including a first conductivity-type semiconductor layer, an active layer, and a second conductivity-type semiconductor layer, disposed on the substrate, a first electrode disposed on the first conductivity-type semiconductor layer, and a second electrode disposed on the second conductivity-type semiconductor layer. The first electrode includes an ohmic contact layer disposed on the first conductivity-type semiconductor layer and formed of a transparent conductive oxide and a reflective layer disposed on the ohmic contact layer, and the thickness of the ohmic contact layer is 1 nm or more and less than 60 nm.

17 Claims, 8 Drawing Sheets

LIGHT EMITTING DEVICE

CROSS REFERENCE TO RELATED APPLICATION

This application claims priority under 35 U.S.C. §119 to Korean Patent Application No. 10-2014-0081739, filed in Korea on Jul. 1, 2014, which is hereby incorporated in its entirety by reference as if fully set forth herein.

TECHNICAL FIELD

Embodiments relate to a light emitting device.

BACKGROUND

Group III-V nitride semiconductors, such as GaN, have excellent physical and chemical properties and are thus widely used as important materials for semiconductor optical devices, such as light emitting diodes (LEDs), laser diodes (LDs) and solar cells.

Group III-V nitride semiconductor optical devices emit blue and green light, have high brightness and high reliability, and are thus widely used as elements of light emitting devices.

In general, a light emitting device may include a light emitting structure and a p-type electrode and an n-type electrode supplying power to the light emitting structure.

The light emitting structure may include an n-type nitride semiconductor layer, an active layer and a p-type nitride semiconductor layer, the p-type electrode may be conductibly connected to the p-type nitride semiconductor layer, and the n-type electrode may be conductibly connected to the n-type nitride semiconductor layer.

SUMMARY

Embodiments provide a light emitting device having enhanced ohmic characteristics and an increased quantity of light.

In one embodiment, a light emitting device includes a substrate, a light emitting structure including a first conductivity-type semiconductor layer, an active layer, and a second conductivity-type semiconductor layer, disposed on the substrate, a first electrode disposed on the first conductivity-type semiconductor layer, and a second electrode disposed on the second conductivity-type semiconductor layer, wherein the first electrode includes an ohmic contact layer disposed on the first conductivity-type semiconductor layer and formed of a transparent conductive oxide and a reflective layer disposed on the ohmic contact layer, wherein the thickness of the ohmic contact layer is 1 nm or more and less than 60 nm.

The ohmic contact layer may include at least one of indium tin oxide (ITO), tin oxide (TO), indium zinc oxide (IZO), indium tin zinc oxide (ITZO), indium aluminum zinc oxide (IAZO), indium gallium zinc oxide (IGZO), indium gallium tin oxide (IGTO), aluminum zinc oxide (AZO), antimony tin oxide (ATO) and gallium zinc oxide (GZO).

The first conductivity-type semiconductor layer may be an n-type semiconductor layer including an n-type dopant and the concentration of the n-type dopant may be 5.0E+18 $cm^{-3}$ to 6.0E+18 $cm^{-3}$.

The thickness of the ohmic contact layer may be 1 nm to 10 nm.

The first electrode may further include a diffusion barrier layer disposed on the reflective layer.

The ohmic contact layer may pass electrons by tunneling effects.

The light emitting device may further include a conductive layer disposed on the second conductivity-type semiconductor layer, the second electrode may be disposed on the conductive layer, and the conductive layer may be formed of a transparent conductive oxide.

The first electrode may further include a bonding layer disposed on the diffusion barrier layer.

The reflective layer may include Ag, Al, Rh or be formed of an alloy including Ag, Al or Rh.

The diffusion barrier layer may include at least one of Ni, Cr, Ti, Pd, Pt, W, Co and Cu.

The second electrode may have the same configuration as the first electrode.

The bonding layer may be formed of any one of gold (Au), silver (Ag) and a gold (Au) alloy.

The light emitting structure may have an area in which the first conductivity-type semiconductor layer is exposed, the first electrode may be disposed on the area in which the first conductivity-type semiconductor layer is exposed, and the ohmic contact layer may directly contact the exposed first conductivity-type semiconductor layer.

The ohmic contact layer may be located only between the reflective layer and the area in which the first conductivity-type semiconductor layer is exposed.

In another embodiment, a light emitting device includes a substrate, a first semiconductor layer disposed on the substrate, having a composition of $In_xAl_yGa_{1-x-y}N$ ($0 \leq x \leq 1$, $0 \leq y \leq 1$, $0 \leq x+y \leq 1$), and including an n-type dopant, an active layer disposed on the first semiconductor layer, a second semiconductor layer disposed on the active layer, having a composition of $In_xAl_yGa_{1-x-y}N$ ($0 \leq x \leq 1$, $0 \leq y \leq 1$, $0 \leq x+y \leq 1$), and including a p-type dopant, a first electrode disposed on the first semiconductor layer, and a second electrode disposed on the second semiconductor layer, wherein the first electrode includes a first ohmic contact layer contacting the first semiconductor layer and formed of a transparent conductive oxide and a first reflective layer disposed on the first ohmic contact layer, wherein the concentration of the n-type dopant is 5.0E+18 $cm^{-3}$ to 6.0E+18 $cm^{-3}$ and the thickness of the ohmic contact layer is 1 nm or more and less than 60 nm.

The first electrode may further include a first diffusion barrier layer disposed on the first reflective layer.

The first electrode may further include a first bonding layer disposed on the first diffusion barrier layer.

The light emitting device may further include a conductive layer disposed on the second semiconductor layer and formed of a transparent conductive oxide, and the second electrode may be disposed on the conductive layer.

The second electrode may further include a second ohmic contact layer disposed on the conductive layer, a second reflective layer disposed on the second ohmic contact layer, a second diffusion barrier layer disposed on the second reflective layer, and a second bonding layer disposed on the second diffusion barrier layer.

In yet another embodiment, a lighting apparatus includes a light source module including a substrate and the light emitting device according to claim 1 disposed on the substrate, a cover configured to diffuse, scatter or excite light supplied from the light source module, and a heat sink coupled with the cover and configured to dissipate heat generated from the light source module.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
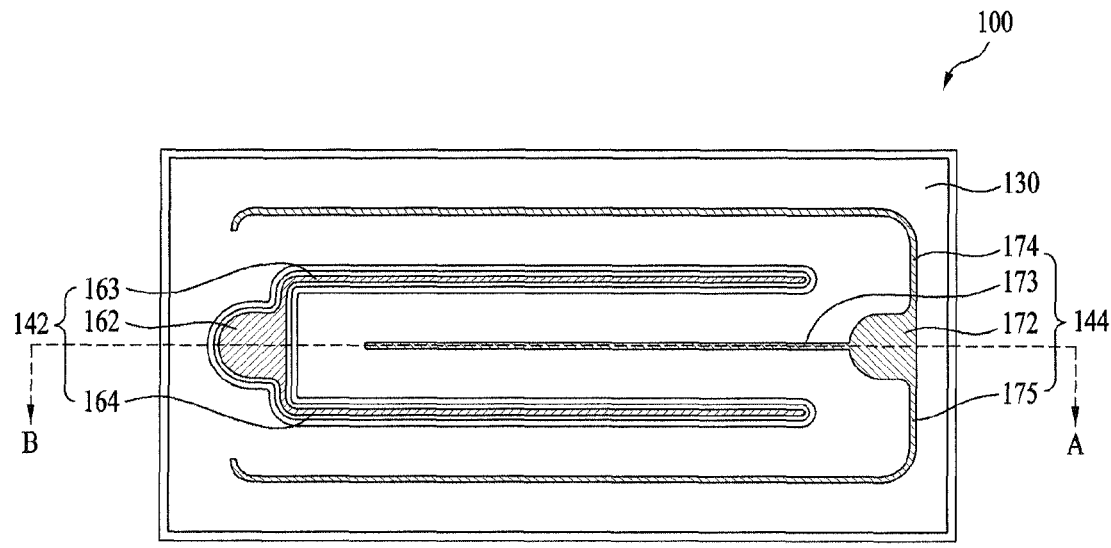
FIG. 1 is a plan view of a light emitting device in accordance with one embodiment.

Hereinafter, embodiments will be described with reference to the annexed drawings. In description of the embodiments, it will be understood that when an element, such as a layer (film), a region, a pattern or a structure, is referred to as being "on" or "under" another element, such as a layer (film), a region, a pad or a pattern, the term "on" or "under" means that the element is directly on or under the other element or intervening elements may also be present. It will also be understood that "on" or "under" is determined based on the drawings.

In the drawings, the sizes of elements may be exaggerated, reduced, or omitted for convenience and clarify of description. Further, the sizes of elements do not mean the actual sizes of the elements. Wherever possible, the same reference numbers will be used throughout the drawings to refer to the same or like parts.

Figure 2:
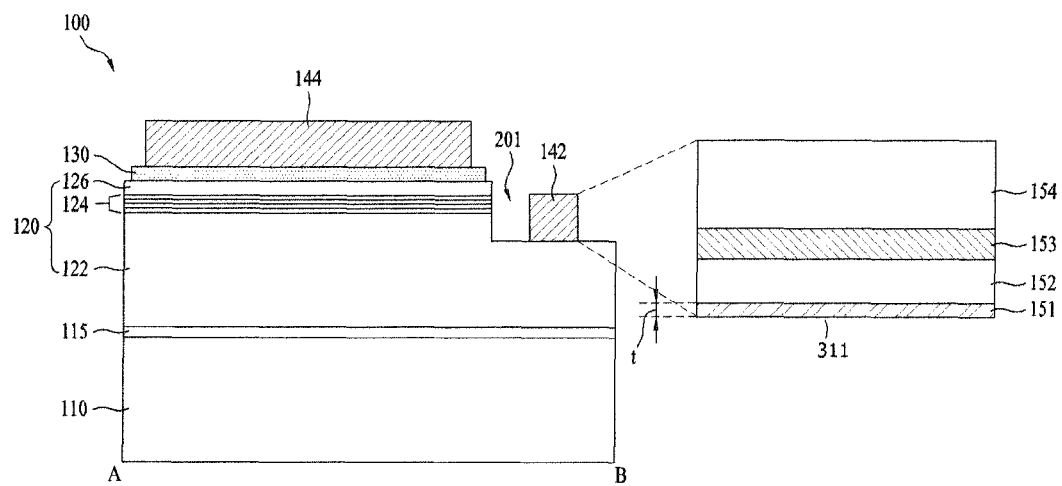
FIG. 2 is a cross-sectional view of the light emitting device shown in FIG. 1, taken along line A-B.

FIG. 1 is a plan view of a light emitting device 100 in accordance with one embodiment and FIG. 2 is a cross-sectional view of the light emitting device 100 shown in FIG. 1, taken along line A-B.

With reference to FIGS. 1 and 2, the light emitting device 100 includes a substrate 110, a buffer layer 115, a light emitting structure 120, a conductive layer 130, a first electrode 142, and a second electrode 144.

The substrate 110 is suitable for growth of a semiconductor thereon. The substrate 110 may be formed of a material having excellent thermal conductivity and be a conductive substrate or an insulating substrate.

For example, the substrate 110 may be any one of a sapphire substrate, a silicone (Si) substrate, a zinc oxide (ZnO) substrate and a nitride semiconductor substrate. Otherwise, the substrate 110 may be a template substrate on which at least one of GaN, InGaN, AlGaN and AlInGaN is stacked.

Unevenness(not shown) for light extraction may be formed on the upper surface of the substrate 110. For example, the substrate 110 may be a patterned sapphire substrate (PSS).

The light emitting structure 120 is disposed on the substrate 110 and generates light.

In order to reduce a difference of lattice constants between the substrate 110 and the light emitting structure 120, the buffer layer 115 may be disposed between the substrate 110 and the light emitting structure 120. The buffer layer 115 may be formed of group II to VI compound semiconductors and include a superlattice structure.

The light emitting structure 120 may include a first conductivity-type semiconductor layer 122, an active layer 124 and a second conductivity-type semiconductor layer 126.

For example, the light emitting structure 120 may have a structure in which the first conductivity-type semiconductor layer 122, the active layer 124 and the second conductivity-type semiconductor layer 126 are sequentially stacked on the substrate 110.

The first conductivity-type semiconductor layer 122 may be disposed on the substrate 110. The first conductivity-type semiconductor layer 122 may be formed of a compound semiconductor, i.e., a group III-V or group II-VI compound semiconductor, and be doped with a first conductivity-type dopant.

The first conductivity-type semiconductor layer 122 may be formed of a semiconductor having a composition of $In_xAl_yGa_{1-x-y}N$ ($0 \le x \le 1$, $0 \le y \le 1$, $0 \le x+y \le 1$). For example, the first conductivity-type semiconductor layer 122 may include any one of InAlGaN, GaN, AlGaN, InGaN, AlN and InN, and be doped with an n-type dopant (for example, Si, Ge, Se, or Te).

The active layer 124 may be disposed between the first conductivity-type semiconductor layer 122 and the second conductivity-type semiconductor layer 126 and generate light by energy generated through recombination of electrons and holes supplied from the first conductivity-type semiconductor layer 122 and the second conductivity-type semiconductor layer 126.

The active layer 124 may be formed of a compound semiconductor, for example, a group III-V or group II-VI compound semiconductor, and have a single well structure, a multi-well structure, a quantum wire structure or a quantum dot structure.

The active layer 124 may have a composition of $In_xAl_yGa_{1-x-y}N$ ($0 \le x \le 1$, $0 \le y \le 1$, $0 \le x+y \le 1$). If the active layer 124 has a quantum well structure, the active layer 124 may include a well layer (not shown) having a composition of $In_xAl_yGa_{1-x-y}N$ $0 \le x \le 1$, $0 \le y \le 1$, $0 \le x+y \le 1$) and a barrier layer (not shown) having a composition of $In_aAl_bGa_{1-a-b}N$ ($0 \le a \le 1$, $0 \le b \le 1$, $0 \le a+b \le 1$).

The well layer and the barrier layer may be alternately stacked at least one time, and the energy bandgap of the well layer may be less than the energy bandgap of the barrier layer.

The second conductivity-type semiconductor layer 126 may be disposed on the active layer 124. The second conductivity-type semiconductor layer 126 may be formed of a compound semiconductor, i.e., a group III-V or group II-VI compound semiconductor, and be doped with a second conductivity-type dopant.

The second conductivity-type semiconductor layer 126 may be formed of a semiconductor having a composition of $In_xAl_yGa_{1-x-y}N$ (0≤x≤1, 0≤y≤1, 0≤x+y≤1). For example, the second conductivity-type semiconductor layer 126 may include any one of InAlGaN, GaN, AlGaN, InGaN, AlN and InN, and be doped with a p-type dopant (for example, Mg, Zn, Ca, Sr or Ba).

A conductive clad layer may be disposed between the active layer 124 and the first conductivity-type semiconductor layer 122 or between the active layer 124 and the second conductivity-type semiconductor layer 126. The conductive clad layer may be formed of a nitride semiconductor (for example, AlGaN, GaN or InAlGaN).

In another embodiment, the light emitting structure 120 may further include a third conductivity-type semiconductor layer (not shown) between the second conductivity-type semiconductor layer 126 and conductive layers 140. The third conductivity-type semiconductor layer may have polarity opposite to the polarity of the second conductivity-type semiconductor layer 126.

Further, in a further embodiment, the first conductivity-type semiconductor layer 122 may be a p-type semiconductor layer and the second conductivity-type semiconductor layer 126 may be an n-type semiconductor layer and, thus, the light emitting structure may include at least one of an N-P junction structure, a P-N junction structure, an N-P-N junction structure and a P-N-P junction structure.

The light emitting structure 120 may have an area 201, for example, a groove, in which a partial area of the first conductivity-type semiconductor layer 122 is exposed, formed by mesa etching.

The conductive layer 130 may be disposed on the light emitting structure 120, for example, the second conductivity-type semiconductor layer 126. For example, the conductive layer 130 may contact the second conductivity-type semiconductor layer 126 and may not contact the first conductivity-type semiconductor layer 122.

The conductive layer 130 may reduce total reflection and have excellent light transmittance and, thus, increase extraction efficiency of light emitted from the active layer 124 toward the second conductivity semiconductor layer 126.

The conductive layer 130 may be formed in a single layered structure or a multi-layered structure using a transparent conductive oxide, for example, at least one of indium tin oxide (ITO), tin oxide (TO), indium zinc oxide (IZO), indium tin zinc oxide (ITZO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au and Ni/IrOx/Au/ITO.

The first electrode 142 is disposed on the first conductivity-type semiconductor layer 122. For example, the first conductivity-type semiconductor layer 122 may be disposed on the area 201 in which a part of the first conductivity-type semiconductor layer 122 is exposed. For example, the shape of the area 201 may coincide with the shape of the first electrode 142, without being limited thereto.

An ohmic contact layer 151 of the first electrode 142 may directly contact the area 201 in which a part of the first conductivity-type semiconductor layer 122 is exposed. The ohmic contact layer 151 may be located only between a reflective layer 152 of the first electrode 142 and the area 201 in which a part of the first conductivity-type semiconductor layer 122 is exposed. For example, the ohmic contact layer 151 may not be disposed in the remainder of the area 201 except an area which the ohmic contact layer 151 directly contacts.

The first electrode 142 may include a first pad part 162 to which a wire is bonded and at least one first branch electrode 163, 164 extending from the first pad part 162.

For example, the first electrode 152 may include one first pad part 162 and two first branch electrodes 163 and 164 extending from the first pad part 162.

The first branch electrodes 163 and 164 of the first electrode 142 may be bilaterally symmetrical with respect to a reference line but are not limited thereto. The reference line may be a line passing through the center of the first pad part 162 and being parallel with one side surface of the light emitting structure 120. For, example the reference line may be the line A-B in FIG. 1.

For example, in order to improve current spreading, the first pad part 162 of the first electrode 142 may be aligned with or overlap a second pad part 172 of the second electrode 144 in a direction parallel with the reference line. For example, the center of the first pad part 162 of the first electrode 142 may be aligned with or overlap the center of the second pad part 172 of the second electrode 144 in a direction parallel with the reference line.

The first electrode 142 may include the ohmic contact layer 151, the reflective layer 152, a diffusion barrier layer 153 and a bonding layer 154.

For example, the ohmic contact layer 151, the reflective layer 152, the diffusion barrier layer 153 and the bonding layer 154 may be sequentially stacked in a direction from the first conductivity-type semiconductor layer 122 to the second conductivity-type semiconductor layer 126.

A contact interface 311 between the ohmic contact layer 151 and the first conductivity-type semiconductor layer 122 may be flat. For example, the interface 311 between the ohmic contact layer 151 and the first conductivity-type semiconductor layer 122 may be parallel with the upper surface of the first conductivity-type semiconductor layer 122.

The ohmic contact layer 151 may directly contact the exposed partial area of the first conductivity-type semiconductor layer 122 and serve to improve ohmic characteristics of the first conductivity-type semiconductor layer 122, i.e., an n-type semiconductor layer.

The ohmic contact layer 151 may include a transparent conductive oxide, for example, at least one of indium tin oxide (ITO), tin oxide (TO), indium zinc oxide (IZO), indium tin zinc oxide (ITZO), indium aluminum zinc oxide (IAZO), indium gallium zinc oxide (IGZO), indium gallium tin oxide (IGTO), aluminum zinc oxide (AZO), antimony tin oxide (ATO) and gallium zinc oxide (GZO), and be formed in a single layered structure or a multi-layered structure. The ohmic contact layer 151 is formed of a transparent conductive oxide and may thus improve light reflectance and light extraction efficiency. Contact between the ohmic contact layer 151 formed of a transparent conductive oxide and the first conductivity-type semiconductor layer 122, i.e., an n-type semiconductor layer, may exhibit ohmic characteristics.

The thickness t of the ohmic contact layer 151 may be 1 nm or more and less than 60 nm.

If the thickness t of the ohmic contact layer 151 is 60 nm or more, although an annealing process which will be described later is executed, ohmic characteristics may not be exhibited. Further, if the thickness t of the ohmic contact layer 151 is less than 1 nm the reflective layer 152 and the first conductivity-type semiconductor layer 122 may directly contact each other due to the excessively thin thickness of the ohmic contact layer 151 and, thus, ohmic characteristics may not be exhibited.

Further, for example, the thickness t of the ohmic contact layer 151 may be 1 nm to 10 nm.

The reason why the thickness t of the ohmic contact layer 151 is set to be 10 nm or less is that the ohmic contact layer 151 may pass or move carriers, for example, electrons, from the first electrode 142 to the first conductivity-type semiconductor layer 122 due to tunneling effects. Thereby, the embodiment may further improve ohmic characteristics and further lower operating voltage.

Further, the thickness t of the ohmic contact layer 151 may be 1 nm to 5 nm. For example, the thickness t of the ohmic contact layer 151 may be 5 nm.

The ohmic contact layer 151 may be formed by depositing a transparent conductive oxide on the first conductivity-type semiconductor layer 122 and then executing the annealing process at a temperature of 200~300° C. For example, in order to form the ohmic contact layer 151, the annealing process may be executed at a temperature of 250° C.

When the transparent conductive oxide is deposited on the first conductivity-type semiconductor layer 122, an electron trap is generated by the transparent conductive oxide due to a localized state and thereby, electrical conductivity may be lowered. In the embodiment, by executing the annealing process at a temperature of 250° C. after formation of the ohmic contact layer 151, a localized state band due to deposition of the transparent conductive oxide may be removed and, thus, electrical conductivity of the ohmic contact layer 151 may be improved.

Further, in the embodiment, by executing the annealing process on the ohmic contact layer 151, bonding force between the ohmic contact layer 151 and the reflective layer 152 may be improved. Since the reflective layer 152 is difficult to come into ohmic contact with the n-type semiconductor layer 122, ohmic characteristics may be improved using the ohmic contact layer 151 formed of a conductive oxide.

Further, the concentration of the first conductivity-type (for example, n-type) dopant (for example, Si) included in the first conductivity-type semiconductor layer 122 may be $1.0E+19$ $cm^{-3}$ or less.

For example, the concentration of the first conductivity-type dopant (for example, Si) included in the first conductivity-type semiconductor layer 122 may be $5.0E+18$ $cm^{-3}$ to $6.0E+18$ $cm^{-3}$.

Thermionic emission current of a semiconductor layer may increase, ohmic characteristics may be improved, and operating voltage may be lowered, in proportion to the concentration of a dopant in the semiconductor layer.

When the concentration of the first conductivity-type dopant included in the first conductivity-type semiconductor layer 122 is $1.0E+19$ $cm^{-3}$, the light emitting device 100 may have a first operating voltage. Hereinafter, a first concentration of the first conductivity-type dopant included in the first conductivity-type semiconductor layer 122 will be $1.0E+19$ $cm^{-3}$.

Since ohmic characteristics are improved and operating voltage may be lowered by tunneling of the ohmic contact layer 151, the light emitting device 100 in the embodiment may acquire operating voltage which is similar or equal to the first operating voltage even if the concentration of the first conductivity-type dopant of the first conductivity-type semiconductor layer 122 is lower than the first concentration. For example, the concentration of the first conductivity-type dopant of the first conductivity-type semiconductor layer 122 may be $5.0E+18$ $cm^{-3}$ to $6.0E+18$ $cm^{-3}$ which is lower than the first concentration.

Figure 3:
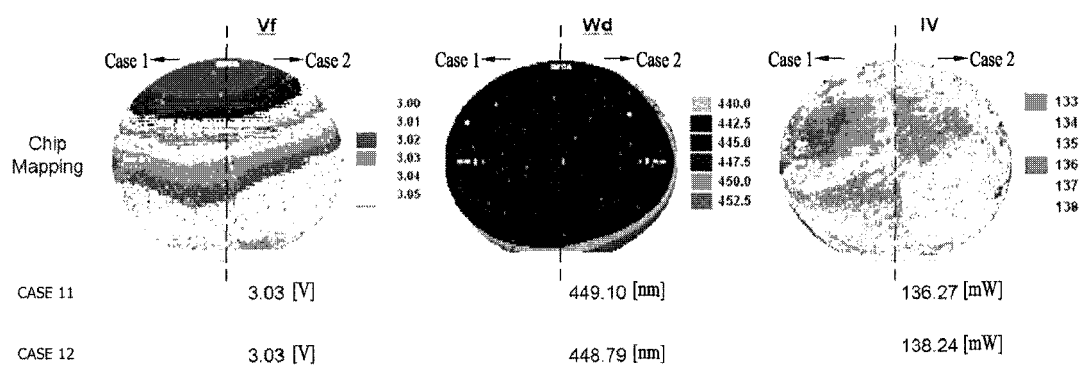
FIG. 3 is a table illustrating experimental results as to operating voltages, emission wavelengths and quantities of light in accordance with the embodiment.
Figure 4A:
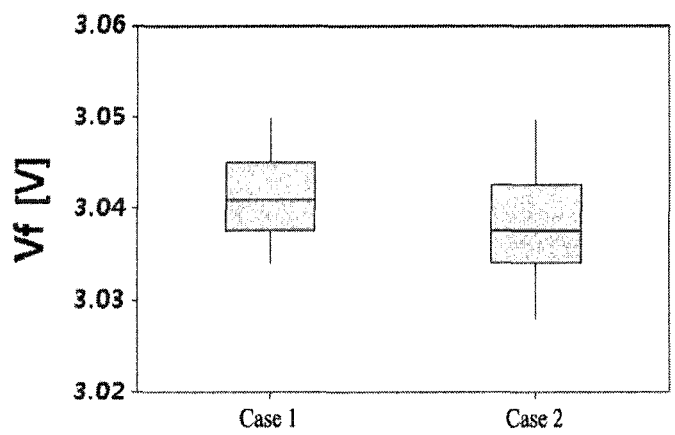
FIG. 4A is a graph illustrating a degree of scattering of operating voltages of FIG. 3 in accordance with the embodiment.
Figure 4B:
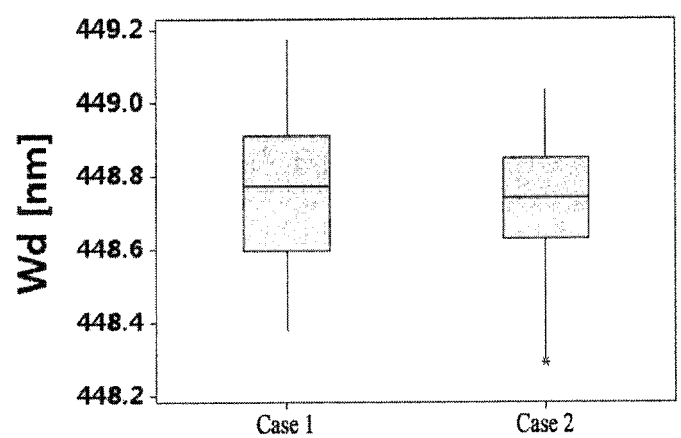
FIG. 4B is a graph illustrating a degree of scattering of emission wavelengths of FIG. 3 in accordance with the embodiment.
Figure 4C:
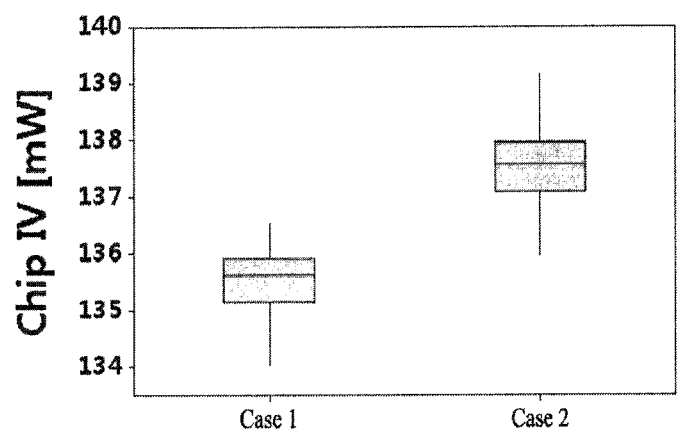
FIG. 4C is a graph illustrating a degree of scattering of quantities of light of FIG. 3 in accordance with the embodiment.

FIG. 3 is a table illustrating experimental results as to operating voltages, emission wavelengths and quantities of light in accordance with the embodiment, FIG. 4A is a graph illustrating a degree of scattering of operating voltages of FIG. 3 in accordance with the embodiment, FIG. 4B is a graph illustrating a degree of scattering of emission wavelengths of FIG. 3 in accordance with the embodiment, and FIG. 4C is a graph illustrating a degree of scattering of quantities of light of FIG. 3 in accordance with the embodiment.

CASE 11 represents experimental results of a general light emitting device having a first conductivity-type semiconductor layer including a dopant of a first concentration without the ohmic contact layer 151.

CASE 12 represents experimental results of the light emitting device having the ohmic contact layer 151 and the first conductivity-type semiconductor layer 122 in accordance with the embodiment. In FIG. 3, case 1 illustrates only a half of a wafer having general light emitting devices and case 2 illustrates only a half of a wafer having light emitting devices including the first conductivity-type semiconductor layer 122 including the dopant of a concentration lower than the first concentration.

With reference to FIGS. 3, 4A, 4B and 4C, the operating voltages of case 1 and case 2 are the same, i.e., 3.03V and, therefrom, it may be understood that, even if the concentration of the first conductivity-type dopant of the first conductivity-type semiconductor layer 122 of case 2 is lower than the first concentration of the first conductivity-type dopant of case 1, the operating voltage is scarcely influenced.

Further, the emission wavelength of case 1 is 449.1 nm, the emission wavelength of case 2 is 448.79 nm, and a difference between the emission wavelengths of the two cases is 0.31 nm. Therefrom, it may be understood that, even if the concentration of the first conductivity-type dopant of the first conductivity-type semiconductor layer 122 of case 2 is lower than the first concentration, the emission wavelength is scarcely changed.

Further, the quantity of light of case 1 is 136.27 mW, the quantity of light of case 2 is 138.24 mW and a difference between the quantities of light of the two cases is 1.97 mW. As compared to case 1, it may be confirmed that, when evaluation using an integrating sphere is carried out, the quantity of light of case 2 is improved by 3%.

The reflective layer 152 may be disposed on the ohmic contact layer 151, reflect light generated from the light emitting structure 120 and, thus, prevent the light generated from the light emitting structure 120 from being absorbed by the diffusion barrier layer 153 and the bonding layer 154 and improve light emission efficiency.

The reflective layer 152 may be formed of a reflective metal, for example, include Ag, Al, Rh or be formed of an alloy including Ag, Al or Rh.

For example, the reflective layer 152 may be formed of an alloy between at least one selected from the group consisting of Cu, Re, Bi, Al, Zn, W, Sn, In and Ni, and silver (Ag).

The diffusion barrier layer 153 may be disposed on the reflective layer 152 and serve to prevent a metal material forming the reflective layer 152 from diffusing to neighboring layers.

The diffusion barrier layer 153 may include, for example, at least one of Ni, Cr, Ti, Pd, Pt, W, Co and Cu, and be formed in a single layered structure or a multi-layered structure.

The bonding layer 154 may be disposed on the diffusion barrier layer 153 and serve as a layer for wire bonding. For example, the bonding layer 154 may be formed of gold (Au), silver (Ag) or a gold (Au) alloy but is not limited thereto.

The second electrode 144 may be disposed on the conductive layer 130.

The second electrode 144 may include the second pad part 172 to which a wire is bonded, and at least one branch electrode 173, 174, 175 extending from the second pad part 172.

The second electrode 144 may include an ohmic contact layer, a reflective layer, a diffusion barrier layer and a bonding layer. For example, the second electrode 144 may have the same configuration as that of the first electrode 142 and the description of the first electrode 142 may be applied to the second electrode 144.

Since the second electrode 144 may contact the conductive layer 130 formed of a transparent conductive oxide, in another embodiment, the second electrode 144 may include a reflective layer, a diffusion barrier layer and a bonding layer without an ohmic contact layer.

Figure 5:
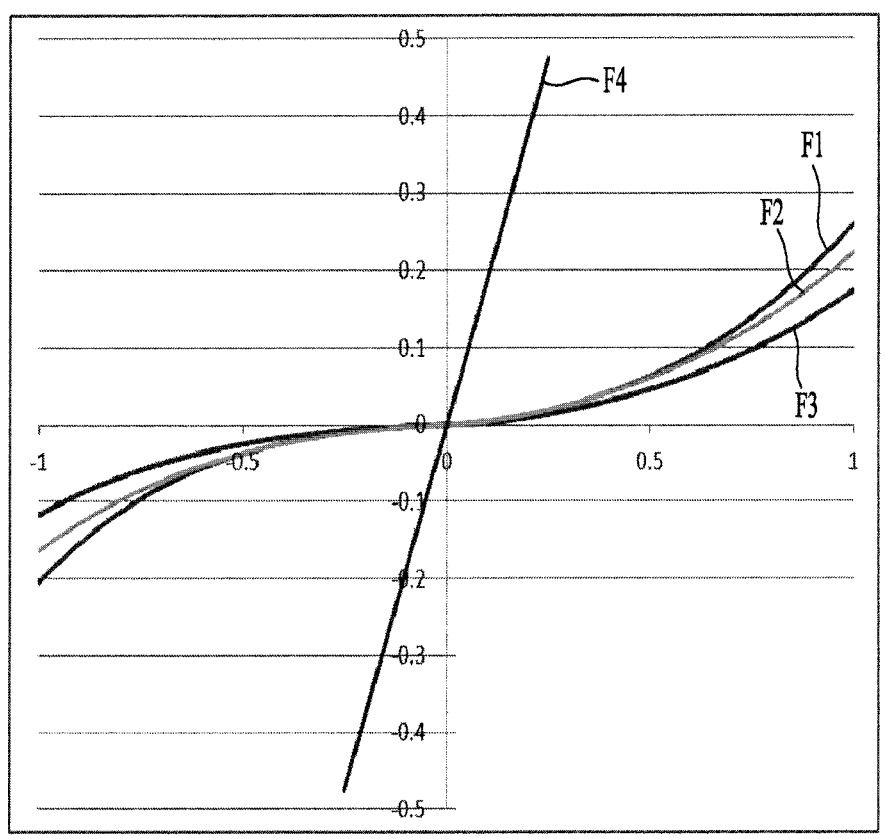
FIG. 5 is a graph illustrating ohmic characteristics of ohmic contact layers which have not gone through annealing, according to thicknesses.

FIG. 5 is a graph illustrating ohmic characteristics of ohmic contact layers which have not gone through annealing, according to thicknesses. Here, the x-axis represents voltage applied to the ohmic contact layers and the y-axis represents current flowing in the ohmic contact layers.

In FIG. 5, the concentration of the dopant (for example, Si) of first conductivity-type semiconductor layers 122 may be $1.0E+19$ cm$^{-3}$, the thickness of reflective layers 152 may be 200 nm, and the thickness of diffusion barrier layers 153 may be 100 nm.

The reflective layers 152 of F1 to F3 may be formed of Ag, the reflective layer 152 of F4 may be formed of Al, the diffusion barrier layers 153 of F1 to F4 may be formed of Ni, the ohmic contact layers 151 of F1 to F3 may be formed of ITO, and the ohmic contact layer 151 of F4 may be formed of Cr.

The thickness of the ohmic contact layer 151 of F1 may be 5 nm, the thickness of the ohmic contact layer 151 of F2 may be 60 nm, and the thickness of the ohmic contact layer 151 of F3 may be 10 nm.

With reference to FIG. 5, it may be confirmed that F1 to F3 do not have ohmic characteristics regardless of thickness of the ohmic contact layers 151.

Figure 6:
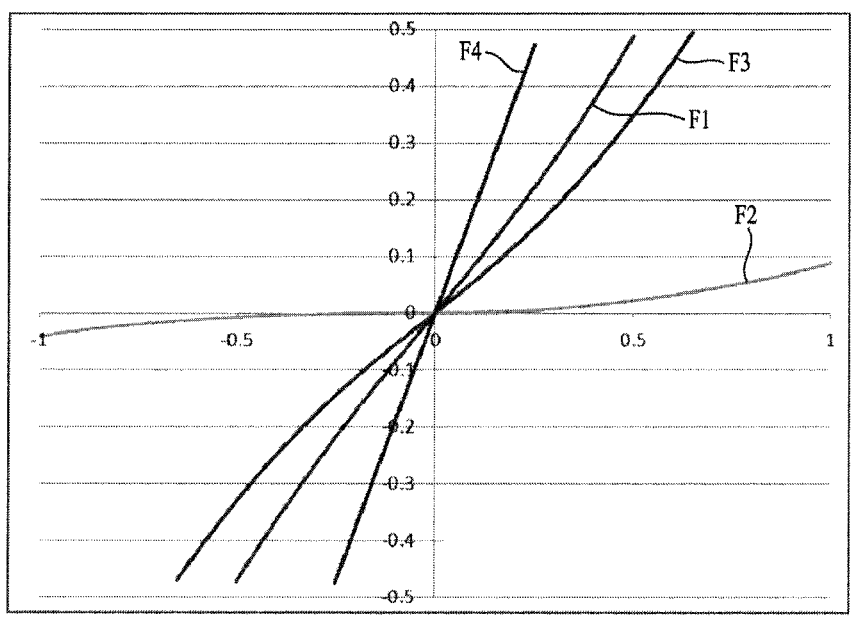
FIG. 6 is a graph illustrating ohmic characteristics of ohmic contact layers which have gone through annealing, according to thicknesses.

FIG. 6 is a graph illustrating ohmic characteristics of ohmic contact layers 151 which have gone through annealing, according to thicknesses. Here, the annealing temperature may be 250° C.

With reference to FIG. 6, it may be confirmed that the ohmic contact layer 151 formed of Cr has ohmic characteristics regardless of thermal treatment.

The thickness of the ohmic contact layer 151 of F1 may be 5 nm, the thickness of the ohmic contact layer 151 of F2 may be 60 nm, and the thickness of the ohmic contact layer 151 of F3 may be 10 nm.

It may be confirmed that, in case of F1 and F3 having the ohmic contact layers 151 having thicknesses of less than 60 nm, ohmic characteristics are exhibited but, in case of F2 having the ohmic contact layer 151 having a thickness of 60 nm, ohmic characteristics are not exhibited. Therefore, it may be confirmed that, in order to exhibit ohmic characteristics due to tunneling effects, the ohmic contact layer 151 needs to have a thickness of less than 60 nm.

Figure 7:
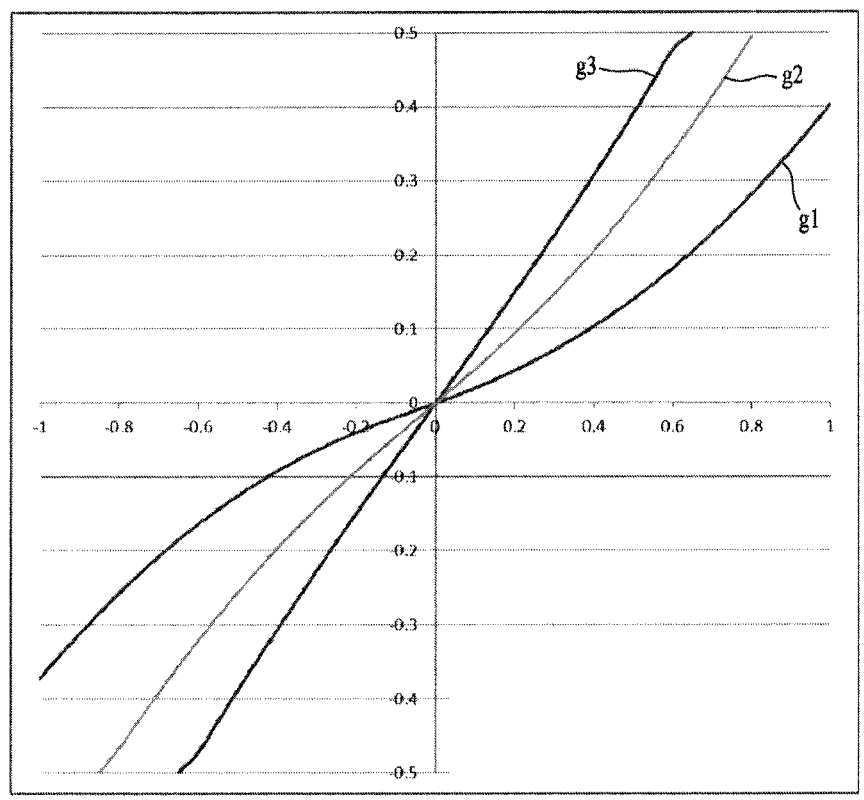
FIG. 7 is a graph illustrating experimental results as to ohmic characteristics of ohmic contact layers according to annealing temperatures.

FIG. 7 is a graph illustrating experimental results as to ohmic characteristics of ohmic contact layers according to annealing temperatures. In FIG. 7, the concentration of the dopant (for example, Si) of first conductivity-type semiconductor layers 122 may be $1.0E+19$ cm$^{-3}$, the thickness of ohmic contact layers 151 formed of ITO may be 5 nm, the thickness of reflective layers 152 formed of Ag may be 200 nm, and the thickness of diffusion barrier layers 153 formed of Ni may be 100 nm.

Here, g1 may be a case that annealing treatment is not carried out, g2 may be a case that annealing treatment is carried out at a temperature of 350° C., and g3 may be a case that annealing treatment is carried out at a temperature of 250° C.

With reference to FIG. 7, it may be confirmed that the ohmic contact layers of g1 and g2 exhibit Schottky characteristics not ohmic characteristics and the ohmic contact layer of g3 exhibits ohmic characteristics. That is, it may be confirmed that, when the annealing process is executed at a temperature of 250° C., ohmic characteristics are exhibited.

In the embodiment, by executing the annealing process at a temperature of 250° C. after formation of the ohmic contact layer 151, a localized state band may be removed and, thus, electrical conductivity of the ohmic contact layer 151 and bonding force between the ohmic contact layer 151 and the reflective layer 152 may be improved.

Figure 8:
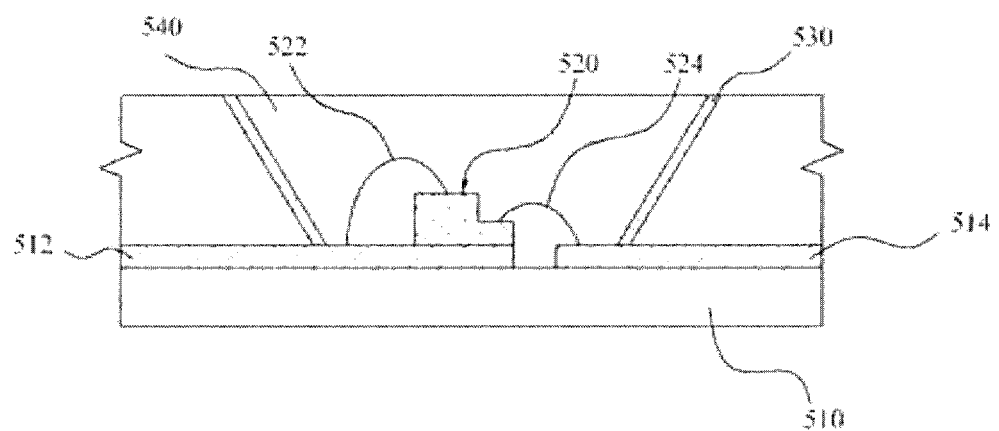
FIG. 8 is a cross-sectional view of a light emitting device package in accordance with one embodiment.

FIG. 8 is a cross-sectional view of a light emitting device package in accordance with one embodiment.

With reference to FIG. 8, the light emitting device package includes a package body 510, a first conductive layer 512, a second conductive layer 514, a light emitting device 520, a reflective plate 530, wires 522 and 524, and a resin layer 540.

The package body 510 may be a substrate having high insulating properties or high thermal conductivity, such as a silicon-based wafer level package, a silicon substrate, a silicon carbide (SiC) substrate or an aluminum nitride (AlN) substrate, and be formed in a structure in which a plurality of substrates is stacked. Embodiments are not limited to the above-described material, structure and shape of the package body 510.

The package body 510 may have a cavity at one region of the upper surface of the package body 510, and the cavity may include side surfaces and a bottom surface. The sidewalls of the cavity may be inclined.

The first conductive layer 512 and the second conductive layer 514 are disposed on the surface of the package body 510 so as to be conductibly isolated from each other in consideration of heat dissipation or mounting of the light emitting device 520. The light emitting device 520 are conductibly connected to the first conductive layer 512 and the second conductive layer 514. Here, the light emitting device 520 may be the light emitting device 100 in accordance with the above-described embodiment.

The reflective plate 530 may be disposed on the sidewalls of the cavity of the package body 510 so as to guide light emitted from the light emitting device 520 in a designated direction. The reflective plate 530 may be formed of a light reflecting material, for example, be a coated metal or a metal flake.

The resin layer 540 surrounds the light emitting device 520 located within the cavity of the package body 510 and protects the light emitting device 520 from external environments. The resin layer 540 may be formed of a colorless and transparent polymer resin, such as epoxy or silicon. The resin layer 540 may include a phosphor so as to change the wavelength of light emitted from the light emitting device 420.

An array of a plurality of light emitting device packages in accordance with the embodiment may be disposed on a substrate and optical members, such as a light guide panel, prism sheets, a diffusion sheet and the like, may be disposed on the light path of the light emitting device packages. Such light emitting device packages, substrate and optical members may function as a backlight unit.

Another embodiment may provide a display apparatus, an indication apparatus or a lighting system including the light emitting device or the light emitting device packages in accordance with the above-described embodiments. For example, the lighting system may include a lamp or a streetlamp.

Figure 9:
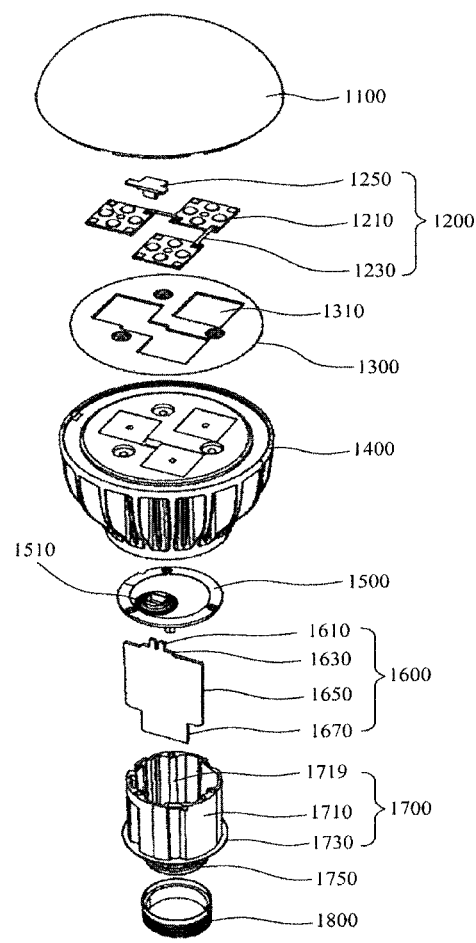
FIG. 9 is an exploded perspective view illustrating a lighting apparatus having light emitting devices in accordance with one embodiment.

FIG. 9 is an exploded perspective view illustrating a lighting apparatus having light emitting devices in accordance with one embodiment.

With reference to FIG. 9, a lighting apparatus in accordance with this embodiment may include a cover 1100, a light source module 1200, a heat sink 1400, a power supply unit 1600, an inner case 1700, and a socket 1800. The lighting apparatus in accordance with this embodiment may further include at least one of a member 1300 and a holder 1500.

The cover 1100 may have a bulb or hemispheric shape which is hollow and is provided with one opened part. The cover 1100 may be optically combined with the light source module 1200. For example, the cover 1100 may diffuse, scatter, or excite light supplied from the light source module 1200. The cover 1100 may be a kind of optical member. The cover 1100 may be combined with the heat sink 1400. The cover 1100 may have a coupling part to be coupled with the heat sink 1400.

The inner surface of the cover 1100 may be coated with a milk-white paint. The milk-white paint may include a light diffuser diffusing light. Surface roughness of the inner surface of the cover 1100 may be greater than surface roughness of the outer surface of the cover 1100. This serves to sufficiently scatter and diffuse light emitted from the light source module 1200 and to discharge the light to the outside.

The cover 1100 may be formed of glass, plastic, polypropylene (PP), polyethylene (PE), polycarbonate (PC), etc. Here, polycarbonate (PC) has excellent light resistance, heat resistance, and strength. The cover 1100 may be transparent so that the light source module 1200 is visible from the outside, or be opaque. The cover 1100 may be formed by blow molding.

The light source module 1200 may be disposed on one surface of the heat sink 1400. Therefore, heat from the light source module 1200 is conducted to the heat sink 1400. The light source module 1200 may include light source units 1210, connection plates 1230, and a connector 1250. The light source unit 1210 may be the light emitting device 100 in accordance with the above-described embodiment.

The member 1300 may be disposed on the upper surface of the heat sink 1400, and include guide holes 1310 into which the plural light source units 1210 and the connector 1250 are inserted. The guide holes 1310 may correspond to or be aligned with substrates of the light source units 1210 and the connector 1250.

A light reflecting material may be applied to or coated on the surface of the member 1300.

For example, a white paint may be applied to or coated on the surface of the member 1300. The member 1300 reflects light, reflected by the inner surface of the cover 1100 and returning toward the light source module 1200, to the cover 1100. Therefore, the member 1300 may enhance luminous efficacy of the lighting apparatus in accordance with this embodiment.

The member 1300 may be formed of, for example, an insulating material. The connection plates 1230 of the light source module 1200 may include an electrically conductive material. Therefore, electrical contact between the heat sink 1400 and the connection plates 1230 may be carried out. The member 1300 formed of an insulating material may prevent electrical short circuit between the connection plates 1230 and the heat sink 1400. The heat sink 1400 receives heat from the light source module 1200 and the power supply unit 1600, and dissipates the heat.

The holder 1500 closes an reception hole 1719 of an insulating part 1710 of the inner case 1700. Therefore, the power supply unit 1600 received in the insulating part 1710 of the inner case 1700 is closed. The holder 1500 has a guide protrusion 1510. The guide protrusion 1510 is provided with a hole through which protrusions 1610 of the power supply unit 1600 pass.

The power supply unit 1600 processes or converts an electrical signal provided from the outside, and then supplies the processed or converted electrical signal to the light source module 1200. The power supply unit 1600 may be received in the reception hole 1719 of the inner case 1700 and be closed within the inner case 1700 by the holder 1500. The power supply unit 1600 may include the protrusions 1610, a guide part 1630, a base 1650, and an extension 1670.

The guide part 1630 protrudes from one side of the base 1650 to the outside. The guide part 1630 may be inserted into the holder 1500. Plural elements may be disposed on one surface of the base 1650. For example, the plural elements may include an AC/DC converter converting AC power supplied from an external power source into DC power, a drive chip to control driving of the light source module 1200, and an electrostatic discharge (ESD) protection element to protect the light source module 1200, without being limited thereto.

The extension 1670 protrudes from the other side of the base 1650 to the outside. The extension 1670 may be inserted into a connection part 1750 of the inner case 1700 and receive an electrical signal provided from the outside. For example, the extension 1670 may have a width equal to or less than the width of the connection part 1750 of the inner case 1700. One end of each of a positive (+) electric wire and a negative (−) electric wire may be conductibly connected to the extension 1670, and the other end of each of the positive (+) electric wire and the negative (−) electric wire may be conductibly connected to the socket 1800.

The inner case 1700 may include a molding part in addition to the power supply unit 1600 therein. The molding part is formed by hardening a molding liquid and serves to fix the power supply unit 160 within the inner case 1700.

Figure 10:
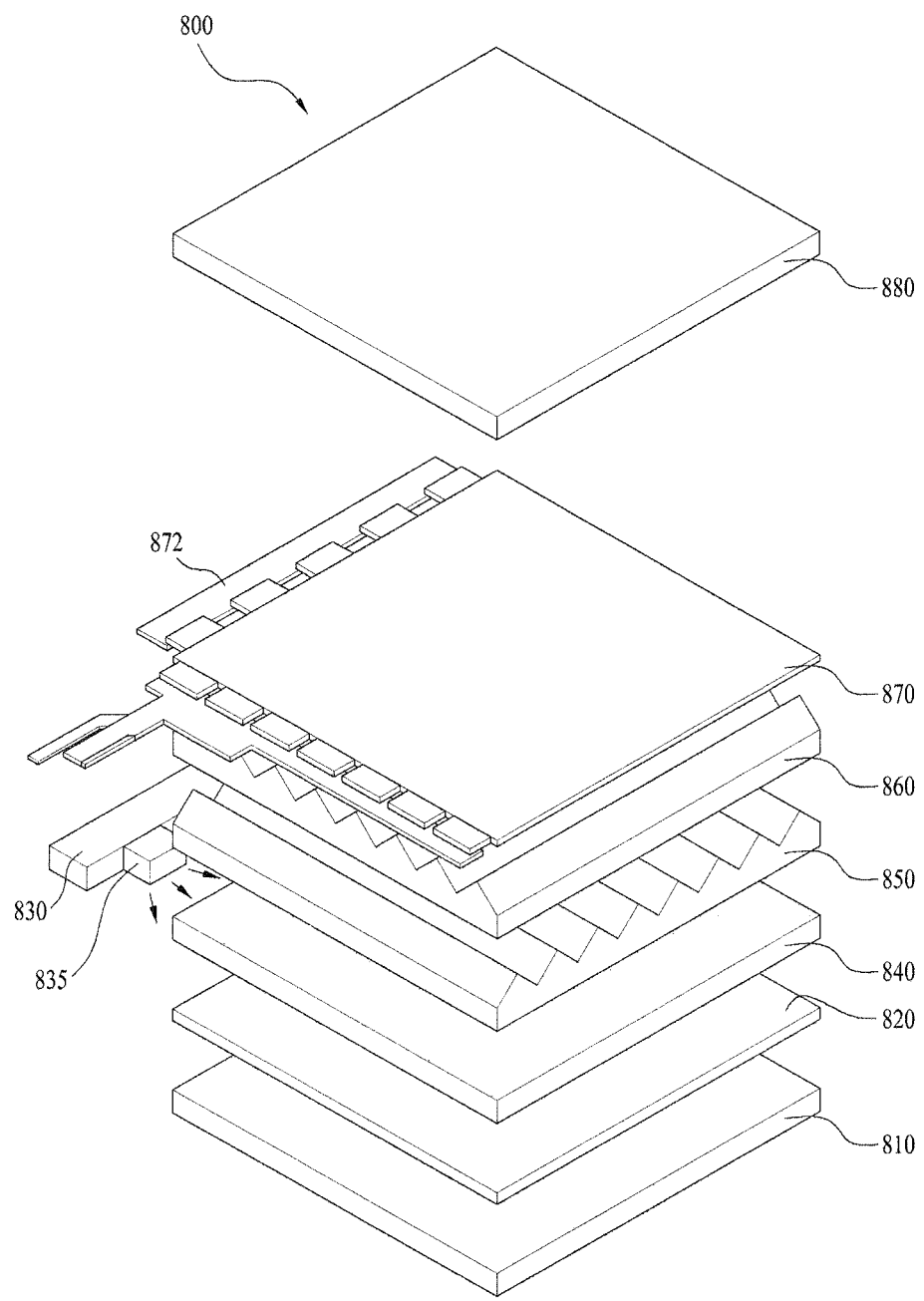
FIG. 10 is an exploded perspective view illustrating a display apparatus having light emitting devices in accordance with one embodiment.

FIG. 10 is an exploded perspective view illustrating a display apparatus having light emitting devices in accordance with one embodiment.

With reference to FIG. 10, a display apparatus 800 in accordance with this embodiment includes a bottom cover 810, a reflective plate 820 disposed on the bottom cover 810, a light emitting module 830, 835 to emit light, a light guide panel 840 disposed in front of the reflective plate 820 and guiding light emitted from the light emitting module 830, 835 in the forward direction of the display apparatus 800, optical sheets including prism sheets 850 and 860 disposed in front of the light guide panel 840, a display panel 870 disposed in front of the optical sheets, an image signal output circuit 872 connected to the display panel 870 and supplying an image signal to the display panel 870, and a color filter 880 disposed in front of the display panel 870. Here, the bottom cover 810, the reflective plate 820, the light emitting module 830, 835, the light guide panel 840 and the optical sheets may form a backlight unit.

The light emitting module 830, 835 may include light emitting device packages 835 mounted on a substrate 830.

Here, a PCB may be used as the substrate 830. The light emitting device package 835 may be the light emitting device package shown in FIG. 8.

The bottom cover 810 may receive elements within the display apparatus 800. The reflective plate 820 may be separately provided, as exemplarily shown in this figure, or be provided by coating the rear surface of the light guide panel 840 or the front surface of the bottom cover 810 with a material having high reflectivity.

Here, the reflective plate 820 may be formed of a material which has high reflectivity and is capable of forming an ultra-thin thickness, and be formed of polyethylene-terephthalate (PET).

The light guide panel 840 may be formed of polymethylmethacrylate (PMMA), polycarbonate (PC), or polyethylene (PE).

The first prism sheet 850 is formed by applying a light-transmitting and elastic polymer to one surface of a support film. The polymer may have a prism layer in which plural 3D structures are repeated. Here, the plural structures may be provided in a stripe pattern in which projections and depressions are repeated, as shown in this figure.

The direction of projections and depressions formed on one surface of a support film of the second prism sheet 860 may be perpendicular to the direction of the projections and the depressions formed on one surface of the support film of the first prism sheet 850. This serves to uniformly disperse light transmitted from the light source module and the reflective sheet 820 in all directions of the display panel 870.

Although not shown in the drawings, a diffusion sheet may be disposed between the light guide panel 840 and the first prism sheet 850. The diffusion sheet may be formed of a polyester or polycarbonate-based material and maximally increase the projection angle of light incident from the backlight unit through refraction and scattering. Further, the diffusion sheet may include a support layer including a light diffuser and a first layer and a second layer formed on an exit surface (a surface in a direction to the first prism sheet) and an incidence surface (a surface in a direction to the reflective sheet) and not including a light diffuser.

In this embodiment, the diffusion sheet, the first prism sheet 850 and the second prism sheet 860 are used as the optical sheets. However, the optical sheets may include other combinations, for example, a micro-lens array, a combination of a diffusion sheet and a micro-lens array, or a combination of one prism sheet and a micro-lens array.

As the display panel 870, a liquid crystal display panel may be provided. Further, in addition to the liquid crystal display panel, other kinds of display devices requiring light sources may be provided.

As apparent from the above description, a light emitting device in accordance with one embodiment may enhance ohmic characteristics and increase a quantity of light.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a substrate;
a light emitting structure including a first conductivity-type semiconductor layer on the substrate, an active layer on the first conductive-type semiconductor layer, and a second conductivity-type semiconductor layer on the active layer, wherein the light emitting structure has a groove and the groove exposes a partial area of the first conductivity-type semiconductor layer;
a first electrode disposed on the partial area of the first conductivity-type semiconductor layer;
a conductive layer disposed on the second conductivity-type semiconductor layer; and
a second electrode disposed on the conductive layer,
wherein a bottom surface of the second electrode contacts a top surface of the conductive layer, the bottom surface of the second electrode being smaller than the top surface of the conductive layer,
wherein the conductive layer is formed of a transparent conductive oxide,
wherein the first electrode includes a first pad part and at least one first branch electrode extending from the first pad part, and
wherein each of the first pad part and the at least one first branch electrode comprises:
a first ohmic contact layer disposed on the partial area of the first conductivity-type semiconductor layer and formed of a transparent conductive oxide; and
a first reflective layer disposed on the first ohmic contact layer,
wherein the thickness of the first ohmic contact layer is 1 nm or more and less than 60 nm,
wherein the first ohmic contact layer of each of the first pad part and the at least one first branch electrode directly contacts the partial area of the first conductivity-type semiconductor layer,
wherein the first ohmic contact layer of each of the first pad part and the at least one first branch electrode is located only between the first reflective layer and the partial area of the first conductivity-type semiconductor layer, and
wherein the first conductivity-type semiconductor layer is an n-type semiconductor layer including an n-type dopant and a concentration of the n-type dopant included in the first conductivity-type semiconductor layer is 5.0E+18 $cm^{-3}$ to 6.0E+18 $cm^{-3}$.

2. The light emitting device according to claim 1, wherein the first ohmic contact layer includes at least one of indium tin oxide (ITO), tin oxide (TO), indium zinc oxide (IZO), indium tin zinc oxide (ITZO), indium aluminum zinc oxide (IAZO), indium gallium zinc oxide (IGZO), indium gallium tin oxide (IGTO), aluminum zinc oxide (AZO), antimony tin oxide (ATO) and gallium zinc oxide (GZO).

3. The light emitting device according to claim 1, wherein the thickness of the first ohmic contact layer is 1 nm to 10 nm.

4. The light emitting device according to claim 1, wherein the first electrode further includes a first diffusion barrier layer disposed on the first reflective layer.

5. The light emitting device according to claim 1, wherein the first ohmic contact layer passes electrons by tunneling effects.

6. The light emitting device according to claim 4, wherein the first electrode further includes a first bonding layer disposed on the first diffusion barrier layer.

7. The light emitting device according to claim 1, wherein the first reflective layer includes Ag, Al, Rh or is formed of an alloy including Ag, Al or Rh.

8. The light emitting device according to claim 4, wherein the first diffusion barrier layer includes at least one of Ni, Cr, Ti, Pd, Pt, W, Co and Cu.

9. The light emitting device according to claim 6, wherein the first bonding layer is formed of any one of gold (Au), silver (Ag) and a gold (Au) alloy.

10. A light emitting device comprising:
a substrate;
a light emitting structure including:
    a first semiconductor layer disposed on the substrate, having a composition of $In_xAl_yGa_{1-x-y}N$ ($0 \leq x \leq 1$, $0 \leq y \leq 1$, $0 \leq x+y \leq 1$), and including an n-type dopant;
    an active layer disposed on the first semiconductor layer;
    a second semiconductor layer disposed on the active layer, having a composition of $In_xAl_yGa_{1-x-y}N$ ($0 \leq x \leq 1$, $0 \leq y \leq 1$, $0 \leq x+y \leq 1$), and including a p-type dopant,
    wherein the light emitting structure has a groove and the groove exposes a partial area of the first semiconductor layer;
a first electrode disposed on the partial area of the first semiconductor layer;
a conductive layer disposed on the second conductivity-type semiconductor layer; and
a second electrode disposed on the conductive layer,
wherein a bottom surface of the second electrode contacts a top surface of the conductive layer, the bottom surface of the second electrode being smaller than the top surface of the conductive layer,
wherein the conductive layer is formed of a transparent conductive oxide,
wherein the first electrode includes a first pad part and at least one first branch electrode extending from the first pad part,
wherein each of the first pad part and the at least one first branch electrode comprises:
    a first ohmic contact layer directly contacting the partial area of the first semiconductor layer and formed of a transparent conductive oxide; and
    a first reflective layer disposed on the first ohmic contact layer,
wherein a concentration of the n-type dopant included in the first semiconductor layer is $5.0E+18$ cm$^{-3}$ to $6.0E+18$ cm$^{-3}$,
wherein the thickness of the first ohmic contact layer is 1 nm or more and less than 60 nm, and
wherein the first ohmic contact layer of each of the first pad part and the at least one first branch electrode is located only between the first reflective layer and the partial area of the first semiconductor layer.

11. The light emitting device according to claim 10, wherein the first electrode further includes a first diffusion barrier layer disposed on the first reflective layer.

12. The light emitting device according to claim 11, wherein the first electrode further includes a first bonding layer disposed on the first diffusion barrier layer.

13. The light emitting device according to claim 10, wherein the second electrode includes:
a second ohmic contact layer disposed on the conductive layer;
a second reflective layer disposed on the second ohmic contact layer;
a second diffusion barrier layer disposed on the second reflective layer; and
a second bonding layer disposed on the second diffusion barrier layer.

14. A lighting apparatus comprising:
a light source module including the light emitting device according to claim 1;
a cover configured to diffuse, scatter or excite light supplied from the light source module; and
a heat sink coupled with the cover and configured to dissipate heat generated from the light source module.

15. The light emitting device according to claim 1, wherein the second electrode comprises:
a second pad part; and
at least one second branch electrode extending from the second pad part, and
wherein the first pad part is aligned with the second pad part in a direction parallel with a reference line passing through a center of the first pad part and parallel with one side surface of the light emitting structure.

16. The light emitting device according to claim 15, wherein the at least first branch electrode has two first branch electrodes bilaterally symmetrical with respect to the reference line.

17. The light emitting device according to claim 1, wherein the second electrode includes:
a second ohmic contact layer disposed on the second conductivity-type semiconductor layer;
a second reflective layer disposed on the second ohmic contact layer;
a second diffusion barrier layer disposed on the second reflective layer; and
a second bonding layer disposed on the second diffusion barrier layer.

\* \* \* \* \*